United States Patent
Zhou et al.

(10) Patent No.: US 8,724,380 B1
(45) Date of Patent: May 13, 2014

(54) METHOD FOR READING AND WRITING MULTI-LEVEL CELLS

(71) Applicant: Avalanche Technology Inc., Fremont, CA (US)

(72) Inventors: Yuchen Zhou, San Jose, CA (US); Ebrahim Abedifard, San Jose, CA (US); Parviz Keshtbod, Los Altos Hills, CA (US); Mahmood Mozaffari, Los Gatos, CA (US); Kimihiro Satoh, Beaverton, OR (US); Bing K Yen, Cupertino, CA (US); Yiming Huai, Pleasanton, CA (US)

(73) Assignee: Avalanche Technology, Inc., Fremont, CA (US)

( * ) Notice: Subject to any disclaimer, the term of this patent is extended or adjusted under 35 U.S.C. 154(b) by 0 days.

(21) Appl. No.: 14/079,518

(22) Filed: Nov. 13, 2013

(51) Int. Cl.
*G11C 13/00* (2006.01)
(52) U.S. Cl.
CPC .......... *G11C 13/0002* (2013.01); *G11C 13/004* (2013.01); *G11C 13/0069* (2013.01)
USPC ............ 365/158; 365/148; 365/163; 365/171
(58) Field of Classification Search
CPC .............. G11C 11/16; G11C 11/1673; G11C 11/1675; G11C 11/56; G11C 11/5678; G11C 13/0002; G11C 13/0033; G11C 13/004; G11C 13/0069
USPC ........... 365/158, 148, 163, 171, 173, 185.03, 365/185.17, 185.19
See application file for complete search history.

(56) References Cited

U.S. PATENT DOCUMENTS

| | | | |
|---|---|---|---|
| 6,643,188 B2 * | 11/2003 | Tanaka et al. ............ 365/189.16 |
| 2012/0134200 A1 | 5/2012 | Khoueir et al. |
| 2012/0243311 A1 | 9/2012 | Chen et al. |
| 2013/0258764 A1 | 10/2013 | Ranjan et al. |

* cited by examiner

*Primary Examiner* — Tan T. Nguyen
(74) *Attorney, Agent, or Firm* — Bing K Yen

(57) ABSTRACT

The present invention is directed to a method for reading and writing an STT-MRAM multi-level cell (MLC), which includes a plurality of MTJ memory elements coupled in series. The method detects the resistance states of individual MTJ memory elements in an MLC by sequentially writing each memory element to the low resistance state in order of ascending parallelizing write current threshold. If a written element switches the resistance state thereof after the write step, then the written element was in the high resistance state prior to the write step. Otherwise, the written element was in the low resistance state prior to the write step. The switching of the resistance state can be ascertained by comparing the resistance or voltage values of the plurality of memory elements before and after writing each of the plurality of memory elements in accordance with the embodiments of the present invention.

21 Claims, 16 Drawing Sheets

READ LOW RESISTANCE

READ HIGH RESISTANCE

WRITE LOW RESISTANCE

WRITE HIGH RESISTANCE

READ LOW RESISTANCE

READ HIGH RESISTANCE

WRITE LOW RESISTANCE

WRITE HIGH RESISTANCE

|  | Resistance States of Memory Elements Ranked by Write Current Thresholds | | | | |
| --- | --- | --- | --- | --- | --- |
|  | 1st | 2nd | 3rd | 4th | 5th |
| Original/Target State | High | Low | High | High | Low |
| After Write Step 304 | Low | Low | Low | Low | Low |
| After 1st Write | High | High | High | High | High |
| After 2nd Write | High | Low | Low | Low | Low |
| After 3rd Write | High | Low | High | High | High |
| After 4th Write | High | Low | High | High | Low |

*FIG. 8*

METHOD FOR READING AND WRITING MULTI-LEVEL CELLS

BACKGROUND

The present invention relates to methods of operating a memory device having a multi-level cell (MLC), and more particularly, to methods of reading and writing a spin transfer torque magnetic random access memory (STT-MRAM) device having an MLC array.

Spin transfer torque magnetic random access memory (STT-MRAM) is a new class of non-volatile memory, which can retain the stored information when powered off. An STT-MRAM device normally comprises an array of memory cells, each of which includes a magnetic memory element and a selection transistor coupled in series between appropriate electrodes. Upon application of an appropriate current to the magnetic memory element, the electrical resistance of the magnetic memory element would change accordingly, thereby switching the stored logic in the respective memory cell.

FIG. 1 is a schematic circuit diagram of a STT-MRAM device 30, which comprises a plurality of memory cells 32, each of the memory cells 32 including a selection transistor 34 coupled to a magnetic memory element 36; a plurality of parallel word lines 38 with each being coupled to a respective row of the selection transistors 34 in a first direction; and a plurality of parallel bit lines 40 with each being coupled to a respective row of the memory elements 36 in a second direction perpendicular to the first direction; and optionally a plurality of parallel source lines 42 with each being coupled to a respective row of the selection transistors 34 in the first or second direction.

The magnetic memory element 36 normally includes a magnetic reference layer and a magnetic free layer with an insulating electron tunnel junction layer interposed therebetween, thereby forming a magnetic tunneling junction (MTJ). An MTJ may have additional layers, such as magnetic pinned layer, seed layer, and magnetic pinning layer, to improve its performance. The magnetic reference layer has a fixed magnetization direction and may be anti-ferromagnetically exchange coupled to a magnetic pinned layer, which has a fixed but opposite or anti-parallel magnetization direction. Upon the application of an appropriate current through the MTJ, the magnetization direction of the magnetic free layer can be switched between two directions: parallel and anti-parallel with respect to the magnetization direction of the magnetic reference layer. The electron tunnel junction layer is normally made of an insulating material with a thickness ranging from a few to a few tens of angstroms. When the magnetization directions of the magnetic free and reference layers are substantially parallel, electrons polarized by the magnetic reference layer can tunnel through the insulating tunnel junction layer, thereby decreasing the electrical resistivity of the MTJ. Conversely, the electrical resistivity of the MTJ is high when the magnetization directions of the magnetic reference and free layers are substantially anti-parallel. The stored logic in the magnetic memory element can be switched by changing the magnetization direction of the magnetic free layer between parallel and anti-parallel with respect to the magnetization direction of the reference layer. Therefore, the MTJ has two stable resistance states that allow the MTJ to serve as a non-volatile memory element.

Based on the relative orientation between the magnetic reference and free layers and the magnetization directions thereof, a MTJ can be classified into one of two types: in-plane MTJ, the magnetization directions of which lie substantially within planes parallel to the same layers, or perpendicular MTJ, the magnetization directions of which are substantially perpendicular to the layer planes.

FIGS. 2A-2D illustrate operation of a conventional STT-MRAM cell including an in-plane MTJ memory element 50 coupled to a selection transistor 52 in series. The MTJ memory element 50 includes a magnetic reference layer 54 having an invariable in-plane magnetization direction 56 and a magnetic free layer 58 having a variable in-plane magnetization direction 60 or 66 with a tunnel junction layer 62 interposed therebetween. FIG. 2A shows with the magnetization direction 60 of the magnetic free layer 58 is parallel to the magnetization direction 56 of the magnetic reference layer 54, resulting in the MTJ memory element 50 in the low resistance state. During read operation, a read current 64 is passed through the MTJ memory element 50 and a corresponding potential of $V_{LOW}$ across the MTJ memory element 50 can be detected. FIG. 2B shows the read operation when the MTJ memory element 50 is in the high resistance state, which is characterized by the magnetic free layer 58 having a magnetization direction 66 that is anti-parallel or opposite to the magnetization direction 56 of the magnetic reference layer 54. A potential of $V_{HIGH}$ across the MTJ memory element 50 can be measured, wherein $V_{HIGH}$ is substantially higher than $V_{LOW}$ in order to distinguish the corresponding high and low resistance states.

FIG. 2C illustrates the write process for switching the resistance state of the MTJ memory element 50 from high to low. As electrons that pass through the magnetic reference layer 54 are being spin-polarized, the spin-polarized electrons exert a spin transfer torque on the magnetic free layer 58, causing the magnetization direction of the magnetic free layer 58 to switch from the anti-parallel 66 to parallel orientation 60 when the spin-polarized current or parallelizing current 68 exceeds a threshold level. It should be noted that the parallelizing write current 68 flows in the opposite direction as the electrons. Conversely, FIG. 2D illustrates the write process for switching the resistance state of the MTJ element 50 from low to high. As electrons pass through the magnetic free layer 58, the electrons with the same spin direction as that of the magnetization in the magnetic reference layer 54 pass into the magnetic reference layer 54 unimpeded. However, the electrons with the opposite spin direction are reflected back to the magnetic free layer 58 at the boundary between the tunnel junction layer 62 and the magnetic reference layer 54, causing the magnetization direction of the magnetic free layer 58 to switch from the parallel to anti-parallel orientation when the anti-parallelizing current 70 exceeds a threshold level.

FIGS. 3A-3D illustrate operation of a conventional STT-MRAM cell including a perpendicular MTJ memory element 80 coupled in series to a selection transistor 82. The MTJ memory element 80 includes a magnetic reference layer 84 having an invariable perpendicular magnetization direction 86 and a magnetic free layer 88 having a variable perpendicular magnetization direction 90 or 96 with a tunnel junction layer 92 interposed therebetween. The operation of the perpendicular MTJ memory element 80 as shown in FIGS. 3A-3D is substantially similar to that of the in-plane MTJ memory element 50 as illustrated in FIGS. 2A-2D and described above. FIGS. 3A and 3B shows the resistance state of the MTJ memory element 80 can be determined by passing a read current 94 therethrough. The resistance state can be switched from high to low by a parallelizing write current 98 flowing in the direction of the MTJ memory element 80 to the selection transistor 82 as illustrated in FIG. 3C. Conversely, FIG. 3D shows the resistance state can be switched from low to high by an anti-parallelizing write current 100 flowing in the opposite direction.

To be cost competitive, a small memory cell size and a memory cell capable of storing multiple bits of data are desired to yield maximum bits per die. Unlike the floating gate based flash memory, such as conventional NAND, which can be programmed to read 4 or more voltage levels, a single MTJ memory element only has two stable resistance states. Therefore, a conventional STT-MRAM device can only store 1 bit of data per cell, which is a disadvantage compared with other memory devices capable of storing multiple bits per cell.

Information relevant to attempts to address this issue can be found in U.S. Pat. Application Publication No. US 2012/0243311 A1 and U.S. Pat. Application Publication No. US 2012/0134200 A1, which disclose MTJ memory cells having two parallel MTJ memory elements coupled to a selection transistor. However, each one of these references suffers from one or more of the following disadvantages: the maximum number of memory elements per selection transistor is limited because of the read operation scheme employed and the parallel memory element layout is not space-efficient for small selection transistors.

For the foregoing reasons, there is a need for a method for operating a space-efficient STT-MRAM MLC cell.

SUMMARY

The present invention is directed to a method for detecting and writing a multi-level cell (MLC), which includes a plurality of memory elements coupled in series. Each of the plurality of memory elements has a first electrical state and a second electrical state. The electrical states can be characterized by electric potential, electric resistance, electric current, or any combination thereof. The MLC has an electrical value corresponding to the electrical states of the memory elements thereof. The electrical value can correspond to any suitable parameter, such as but not limited to voltage, resistance, current, or any combination thereof. Each memory element can be switched from the first electrical state to the second electrical state by a first switching input no less than a first switching input threshold. Conversely, each memory element can be switched from the second electrical state to the first electrical state by a second switching input no less than a second switching input threshold. The first and second switching input thresholds of any element in the MLC are substantially different from those of the rest of the elements in the MLC such that writing any memory element of the MLC would not perturb the electrical states of the memory elements that have higher switching input thresholds. The switching inputs can be in the form of any suitable switching means, such as but not limited to electric potential, electric field, electric current, magnetic field, temperature, pressure, mechanical stress, or any combination thereof. Moreover, the first and second switching inputs can have the same polarity (unipolar) or opposite polarities (bipolar).

The method for detecting the electrical states of individual memory elements of an MLC by sequentially writing each memory element to the second electrical state in order of ascending write input threshold. If a written element switches the electrical state thereof after the write step, then the written element was in the first electrical state prior to the write step. Otherwise, the written element was in the second electrical state prior to the write step. The switching of the electrical state may be ascertained by comparing the electrical values of the plurality of memory elements before and after writing each of the plurality of memory elements in accordance with several embodiments of the present invention. If there is no substantial difference between the electrical values before and after writing, then the electrical state of the written element has not switched. If there is substantial difference between the electrical values before and after writing, then the electrical state of the written element has switched. The method of the present invention may include the optional step of sequentially writing each of the plurality of memory elements to the original electrical state thereof from the second electrical level in order of descending first and second write input thresholds. The same method can also be used to write the plurality of memory elements from an arbitrary set of electrical states to another arbitrary set of electrical states by writing each element in order of descending first and second write input thresholds.

These and other features, aspects, and advantages of the present invention will become better understood with reference to the following description and appended claims.

BRIEF DESCRIPTION OF THE DRAWINGS

These and other features, aspects, and advantages of the present invention will become better understood with regard to the following description, appended claims, and accompanying drawings where:

FIG. 8 is a table that illustrates changes in resistances states of MLC memory elements during the write sequence in accordance with a method embodiment of the present invention;

For purposes of clarity and brevity, like elements and components will bear the same designations and numbering throughout the Figures, which are not necessarily drawn to scale.

DETAILED DESCRIPTION

In the Summary above and in the Detailed Description, and the claims below, and in the accompanying drawings, reference is made to particular features, including method steps, of the invention. It is to be understood that the disclosure of the invention in this specification includes all possible combinations of such particular features or steps. For example, where a particular feature or step is disclosed in the context of a particular aspect or embodiment of the invention, or a particular claim, that feature or step can also be used, to the extent possible, in combination with and/or in the context of other particular aspects and embodiments of the invention, and in the invention generally.

Where reference is made herein to a method comprising two or more defined steps, the defined steps can be carried out in any order or simultaneously, except where the context excludes that possibility, and the method can include one or more other steps which are carried out before any of the defined steps, between two of the defined steps, or after all the defined steps, except where the context excludes that possibility.

While the following discussion of various embodiments will primarily focus on STT-MRAM, it will be noted that this is merely for purposes of illustration. The methods disclosed herein can be readily adapted for any type of MLC memory cell that stores data bits in the form of different resistance states, such as Resistive RAM and Phase Change RAM.

Figure 1:
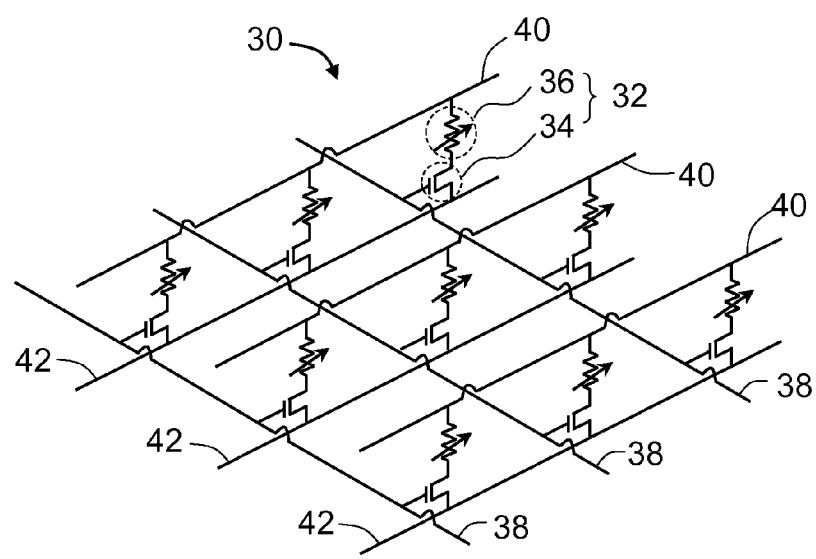
FIG. 1 is a schematic circuit diagram of a conventional STT-MRAM device.
Figure 2A:
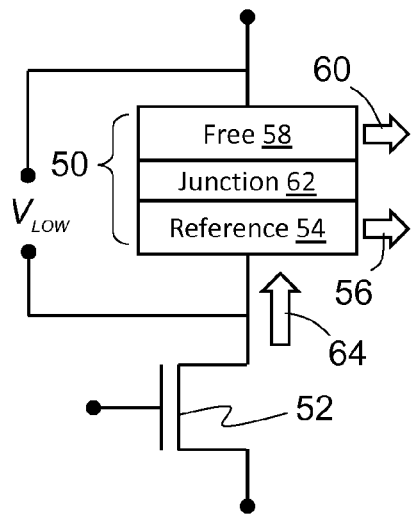
FIGS. 2A-2D are schematic views illustrating read and write operations for a conventional STT-MRAM cell including an in-plane MTJ memory element.
Figure 2B:
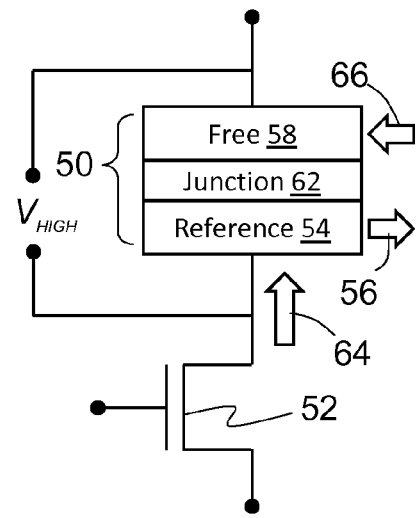
Figure 2C:
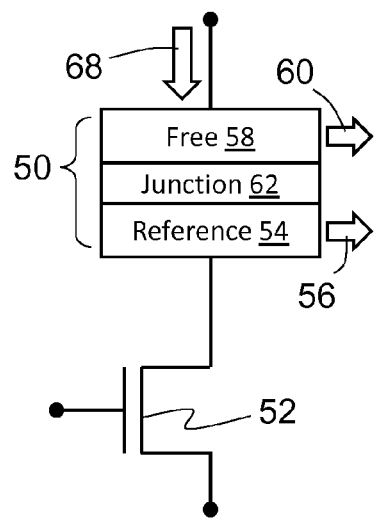
Figure 2D:
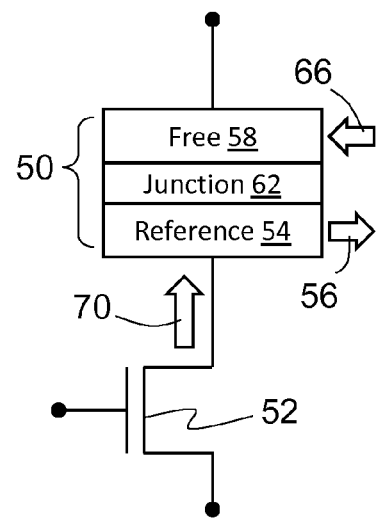
Figure 3A:
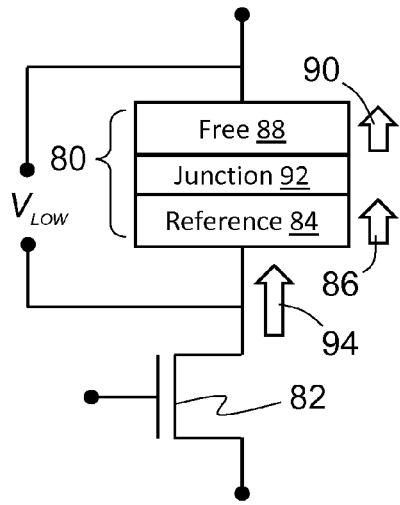
FIGS. 3A-3D are schematic views illustrating read and write operations for a conventional STT-MRAM cell including a perpendicular MTJ memory element.
Figure 3B:
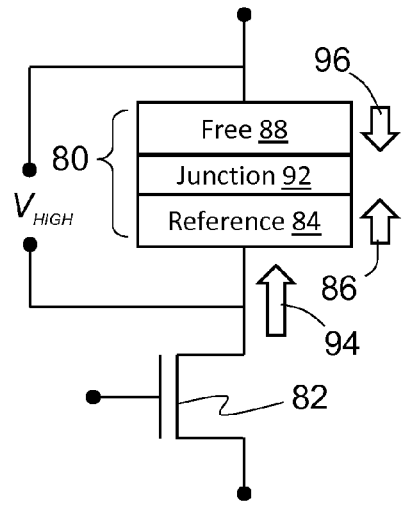
Figure 3C:
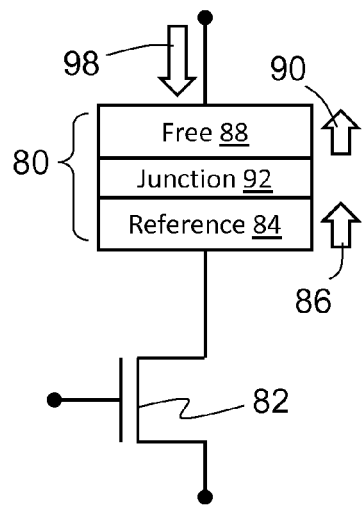
Figure 3D:
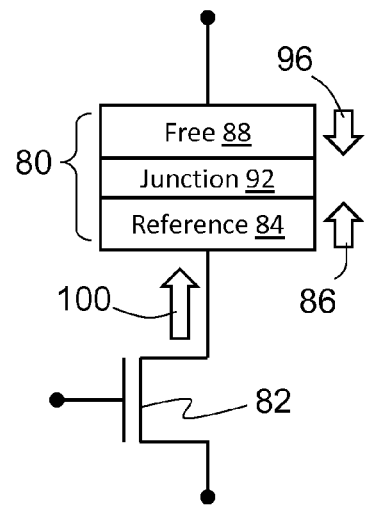
Figure 4:
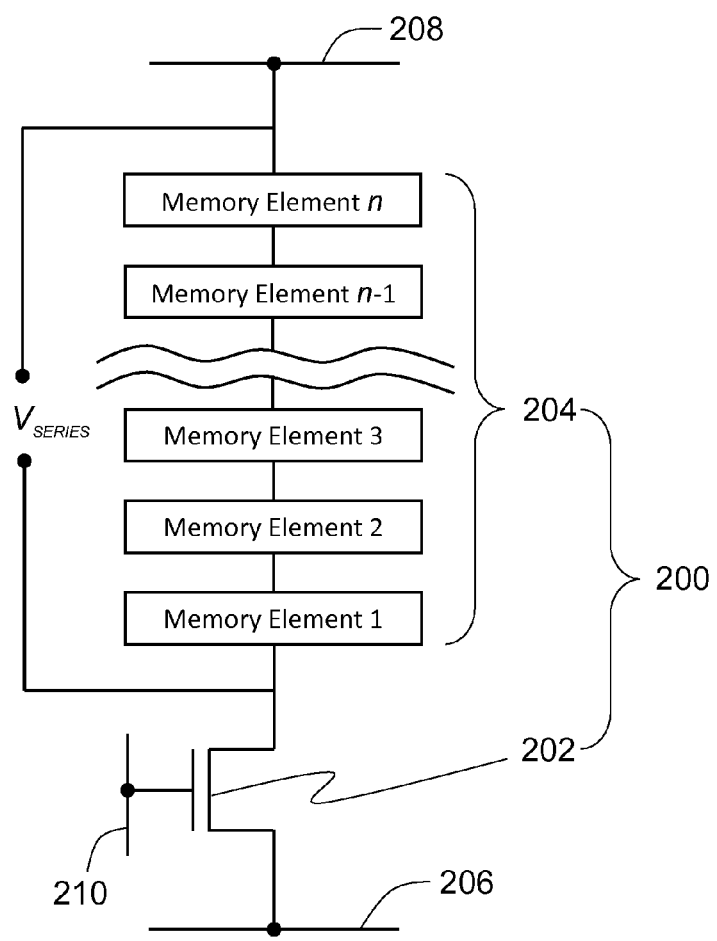
FIG. 4 is a schematic view of a STT-MRAM MLC, including multiple MTJ memory elements coupled in series, that can be used with the method embodiments of the present invention.
Figure 5:
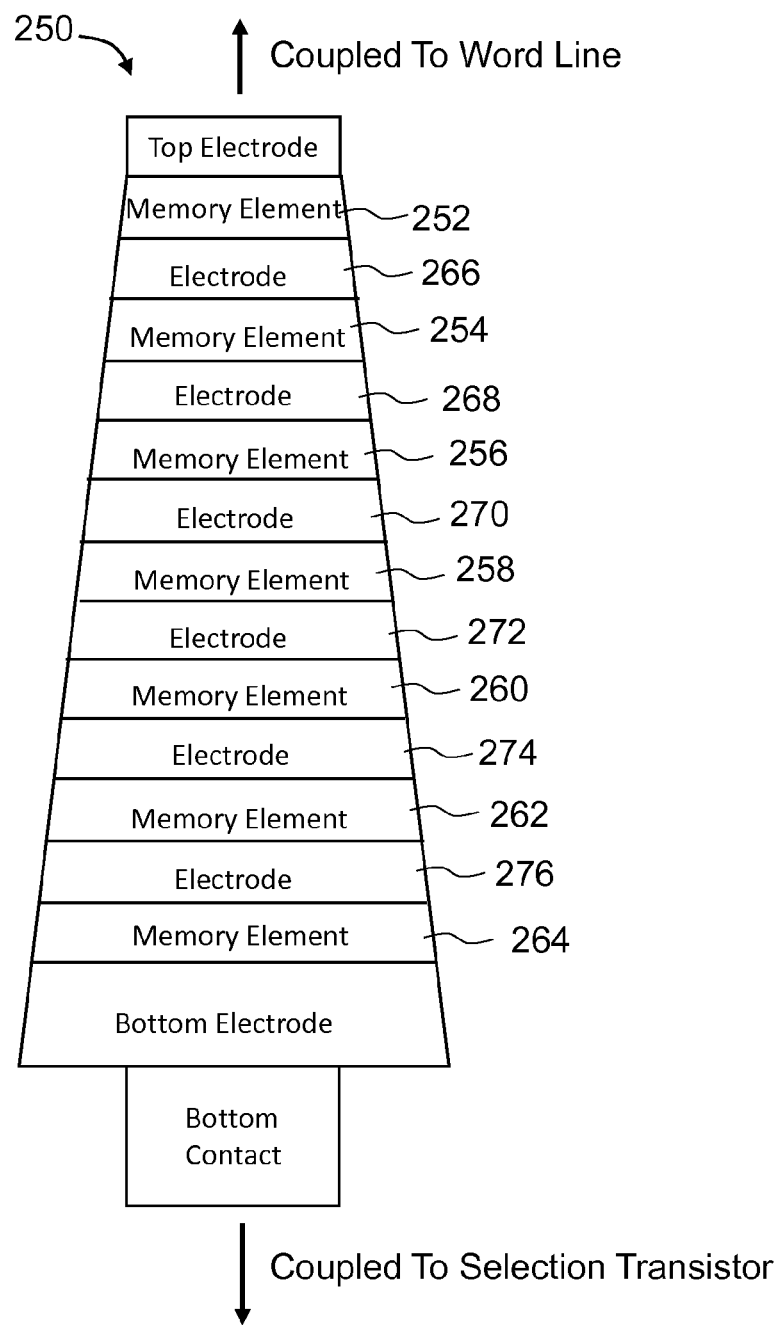
FIG. 5 is a cross sectional view of an exemplary STT-MRAM MLC corresponding to the schematic view of FIG. 4.

FIG. 4 illustrates an STT-MRAM multi-level cell (MLC) 200 that may be used with the method embodiments of the present invention. The MLC 200 includes a selection transistor 202 coupled to a series of MTJ memory elements 204 in series between a source line 206 and a bit line 208. The gate of the selection transistor 202 is coupled to a word line 210. The series of MTJ memory elements 204 comprise n number of MTJ memory elements, where n is an integer greater than one. The series of MTJ memory elements 204 each includes at least one magnetic reference layer and at least one magnetic free layer with an insulating electron tunnel junction layer interposed therebetween. The magnetization directions of the magnetic reference and free layers may lie in or perpendicular to the layer planes. The series of MTJ memory elements 204 each may further include additional magnetic and non-magnetic layers therein, such as but not limited to magnetic pinning layer, magnetic pinned layer, magnetic fixed layer, anti-ferromagnetic layer, anti-ferromagnetic coupling layer, magnetic assist layer, magnetic balance layer, non-magnetic spacer layer, non-magnetic separation layer, non-magnetic seed layer, non-magnetic capping layer, and non-magnetic perpendicular enhancement layer. Various types of MTJ memory elements may be utilized together in the series of MTJ memory elements 204. For example, one of the series of MTJ memory elements 204 may be an in-plane MTJ memory element which includes an in-plane magnetic reference layer and an in-plane magnetic free layer with a tunnel junction layer interposed therebetween, while another memory element may be a perpendicular MTJ memory element that has additional layers, such as magnetic pinned layer and perpendicular enhancement layer. A physical example of the series of MTJ memory elements 204 is illustrated in FIG. 5. The MLC memory stack 250 of FIG. 5 has a trapezoidal shape and includes 7 MTJ memory elements 252-264 separated by 6 electrodes 266-276. Assuming all MTJ memory elements 252-264 have substantially similar film structures, then the top MTJ memory element 252, which has the smallest planar dimension, would have the lowest write current threshold. Accordingly, the bottom MTJ memory element 264, which has the largest planar dimension, would have the highest write current threshold.

With continuing reference to FIG. 4, the resistance state of each of the series of MTJ memory elements 204 has a low resistance level and a high resistance level corresponding to the parallel and anti-parallel magnetization configurations, respectively. The resistance state of each of the series of MTJ memory elements 204 can be switched from the low to the high resistance state by an anti-parallelizing write current no less than an anti-parallelizing write current threshold. Similarly, the resistance state can be switched back from the high to the low resistance state by a parallelizing write current not less than a parallelizing write current threshold level. Moreover, the parallelizing and anti-parallelizing write current thresholds of any of the series of MTJ memory elements 204 are substantially different from those of the rest of the series of MTJ memory elements 204 such that writing any of the series of MTJ memory elements 204 would not perturb the resistance states of ones that have higher write current thresholds. The MLC memory stack 250 of FIG. 5 is an example of a series of MTJ memory elements having different write current thresholds because of different planar dimensions thereof. Alternatively, MTJ memory elements with different write current thresholds can be fabricated by changing the MTJ film structure and/or film properties. It should be noted that the MTJ memory elements in the series 204 do not have to be physically arranged in sequential order of increasing or decreasing write current threshold to practice the present invention.

Operation of the STT-MRAM MLC 200 according to a method embodiment of the present invention for detecting individual resistance states of the series of MTJ memory elements 204 having n number of MTJ memory elements coupled in series will now be described with reference to FIG. 6. The process begins by reading an initial voltage value, $V_{SERIES}$, of the series of MTJ memory elements 204 and then storing or saving the initial voltage value in a buffer entry 302. After the initial voltage reading, each of the n number of the MTJ memory elements in the series 204 is sequentially written to the low resistance state from the element with the lowest parallelizing write current threshold to the element with the highest parallelizing write current threshold 304. The write current for switching a memory element may be no less than the write current threshold thereof but less than those of elements with higher write current thresholds so as not to perturb the resistance states thereof.

After each writing, the voltage value of the series of MTJ memory elements 204 is read and then sequentially stored or saved in a corresponding buffer entry 306. For example, an MLC comprising four memory elements coupled in series would require four write steps and five buffer entries to store the voltage values. The initial voltage value of the MLC will be saved in the first buffer entry. The voltage value of the MLC after the element with the lowest write current threshold is written to the low resistance state is then saved in the second buffer entry. The process is repeated until the element with the highest write current threshold is written and the corresponding MLC voltage value is saved in the fifth or last buffer entry. If an element is already in the low resistance state prior to writing, the element will remain in the low resistance state after writing, thereby resulting in no substantial voltage change for the series of MTJ memory elements 204 after writing the element. If an element is in the high resistance state prior to writing, the element will switch to the low resistance state after writing, thereby resulting in substantial voltage decrease for the series of MTJ memory elements 204 after writing the element when measured with the same read current.

Figure 7:
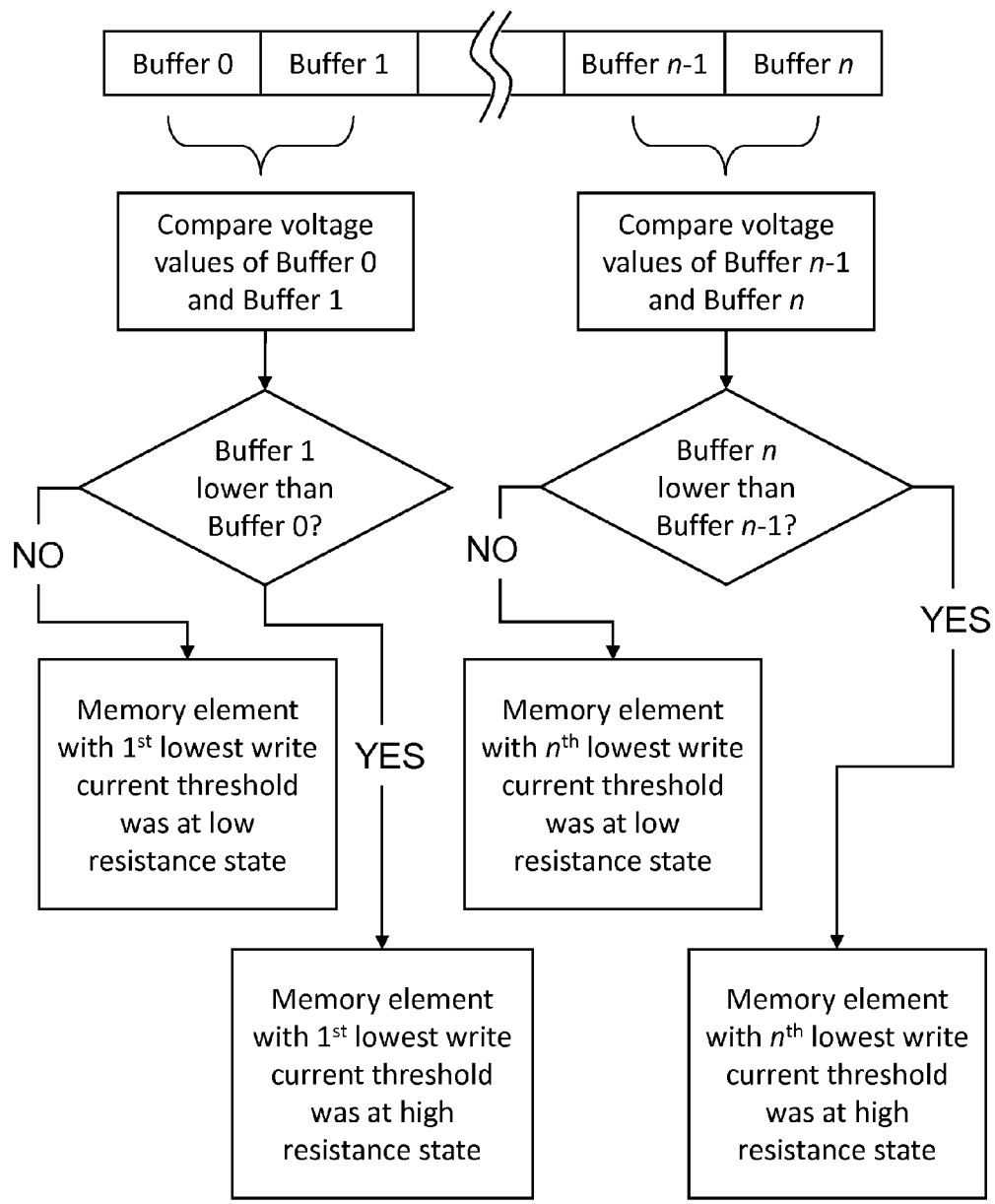
FIG. 7 illustrates selected stages of a comparison method to determine whether a memory element has switched the resistance state thereof for the embodiment of FIG. 6.

After the voltage values are stored in the buffer, the original resistance states of individual memory elements of the series of MTJ memory elements 204 can be identified by comparing the voltage values of consecutive pair entries saved in the buffer 308. The process of comparing the voltage values saved in the buffer to determine the original resistance states of individual memory elements 308 is illustrated in FIG. 7. The buffer has n+1 entries for the series of MTJ memory elements 204 including n number of memory elements. The first buffer entry (Buffer 0) and the second buffer entry (Buffer 1) represent the voltage values of the series of MTJ memory elements 204 before and after the element with the lowest write current threshold is written to the low resistance state. Since an element can initially be in the high or low resistance state, writing the element to the low resistance state can result in a decrease or no substantially change in the voltage value of the series of MTJ memory elements 204. Accordingly, if the value of the second buffer entry (Buffer 1) is lower than that of the first entry (Buffer 0), then the element with the lowest write current threshold was in the high resistance state prior to the write process. If there is no substantial difference between the values of the second buffer entry (Buffer 1) and the first entry (Buffer 0), then the element was in the low resistance state prior to the write process. The above described analysis is applied to the second and third buffer entries (Buffers 1 and 2), the third and fourth buffer entries (Buffers 2 and 3), and so on until the individual resistance states of all n number of memory elements are identified. It should be noted that the step of comparing buffer values 308 can begin with at least two entries in the buffer, after which the step of comparing buffer value 308 can run concurrently with the write process 304 and the read process 306 before all memory elements are written to the low resistance state. Instead of using the voltage value to characterize the resistance states of the series of MTJ memory elements 204 as describe above, the resistance value, which is calculated from voltage and current, may also be used to characterize the resistance states of the series of MTJ memory elements 204, especially when the read current is not constant. Moreover, the read current that flows through the series of MTJ memory elements 204 when a pre-determined voltage is applied to the series of MTJ memory elements 204 can also be used to characterize the resistance states thereof.

The current approach of sequentially writing the memory elements with ascending write current threshold for identifying the resistance states of individual elements can advantageously isolate the resistance change to the written memory element because the resistance states of the memory elements with lower write current thresholds remain the same and the resistance states of the memory elements with higher write current thresholds are not perturbed.

Referring back to FIG. 6, after the resistance states of all individual memory elements are identified by comparing the buffer values 308, the resistance states of all individual memory elements of the series of MTJ memory elements 204 are in the low resistance state. Accordingly, the method embodiment of the present invention for detecting individual resistance states may further include the step of writing individual memory elements back to the original states thereof 310. This can be accomplished by sequentially writing each of the series of MTJ memory elements 204 from one with the highest parallelizing and anti-parallelizing write current thresholds to one with the lowest parallelizing and anti-parallelizing write current thresholds. Such hierarchical writing scheme would prevent the write process from perturbing the resistance states of previously written memory elements. For example, FIG. 8 shows the resistance states of an MLC including 5 memory cells coupled in series that have the original resistance states of high, low, high, high, and low for the 5 memory elements in descending write current thresholds, respectively. The first write step switches the element ($1^{st}$) with the highest write current thresholds and all other elements to the low resistance state. The second write step uses a parallelizing write current that is less than the parallelizing write current threshold of the element with the highest write current thresholds to write the elements with the second, third, fourth, and fifth highest write current thresholds to the low resistance state. The third write step uses an anti-parallelizing write current that is less than the anti-parallelizing write current threshold of the element with the second highest write current thresholds to write the elements with third, fourth, and fifth highest write current thresholds to the high resistance state. Since the third write step switches both elements of the third and fourth highest write current thresholds to the high resistance state, only a fourth write step is needed to switch the element with the fifth highest write current thresholds to the low resistance state. It should be noted that the writing of an MLC including n number of memory elements would require no more than n write steps according to the present invention. The number of write steps can be reduced if memory elements with consecutive write current threshold ranking are in the same resistance state.

The above-described method of writing individual memory elements of an MLC back to the original states thereof 310 can also be used as a general write method for writing an MLC with a set of arbitrary resistance states to a set of desired resistance states. Such a writing method would normally entail multiple write steps as illustrated in the example of FIG. 8. Moreover, switching the resistance state of a single memory element may require writing other elements as well, especially if the single memory element has relatively high write current thresholds. Accordingly, it is preferable to store frequently accessed data in memory elements with low write current thresholds.

Another method embodiment of the present invention for detecting individual resistance states of the series of MTJ memory elements 204 having n number of MTJ memory elements coupled in series will now be described with reference to FIG. 9. The process begins by measuring or reading an initial voltage value of the series of MTJ memory elements 204 and then storing or saving the initial resistance value in a first buffer entry (Buffer 0) 352. The voltage value may be determined from the measured potential change across the series of MTJ memory elements 204, $V_{SERIES}$. After the initial voltage reading, each of the n number of the MTJ memory elements in the series 204 is sequentially written to the low resistance state in order of ascending parallelizing write current threshold 354. The write current for switching a memory element may be no less than the write current threshold thereof but less than those of elements with higher write current thresholds so as not to perturb the resistance states thereof.

After writing each memory element, the voltage value of the series of MTJ memory elements 204 is read and then saved in a second buffer entry (Buffer 1) 356. After the voltage values are saved in the first buffer entry (Buffer 0) and the second buffer entry (Buffer 1), the original resistance state of the memory element can be identified by comparing the voltage values in Buffers 0 and 1 358, as illustrated by the process diagram in FIG. 10. The process of determining the resistance state as illustrated in FIG. 10 is similar to that illustrated in FIG. 7 for the embodiment of FIG. 6, which uses n+1 buffer entries for an MLC with n number of memory elements. The method embodiment of FIG. 9, however, requires only two buffer entries, which are continuously updated or refreshed with each new writing. Referring now to FIG. 10, the first buffer entry (Buffer 0) and the second buffer entry (Buffer 1) represent the voltage values of the series of MTJ memory elements 204 before and after element i with the ith lowest write current threshold is written to the low resistance state. Since an element can initially be in the high or low resistance state, writing element i to the low resistance state can result in a decrease or no substantially change in the voltage value of the series of MTJ memory elements 204. Accordingly, if the value of the second buffer entry (Buffer 1) is lower than that of the first entry (Buffer 0), then element i was in the high resistance state prior to the write process. If there is no substantial difference between the values of the second buffer entry (Buffer 1) and the first entry (Buffer 0), then element i was in the low resistance state prior to the write process.

After the resistance state of element i is identified after each writing, the voltage value of Buffer 0 is replaced with the voltage value of Buffer 1 360. The above-described process steps of writing the memory element 354, reading voltage value of the series of memory elements and saving the value in Buffer 1 356, comparing the values saved in the buffer to determine the resistance state of the element 358, and replacing the values of Buffer 0 with the value of Buffer 1, are repeated for all elements in order of ascending parallelizing current threshold.

Referring back to FIG. 9, after the resistance states of all individual memory elements are identified by comparing the buffer values 360, the resistance states of all individual memory elements of the series of MTJ memory elements 204 will be in the low resistance state. Accordingly, the method embodiment of the present invention for detecting individual resistance states may further include the step of writing individual memory elements back to the original states thereof 310 as described above.

Figure 6:
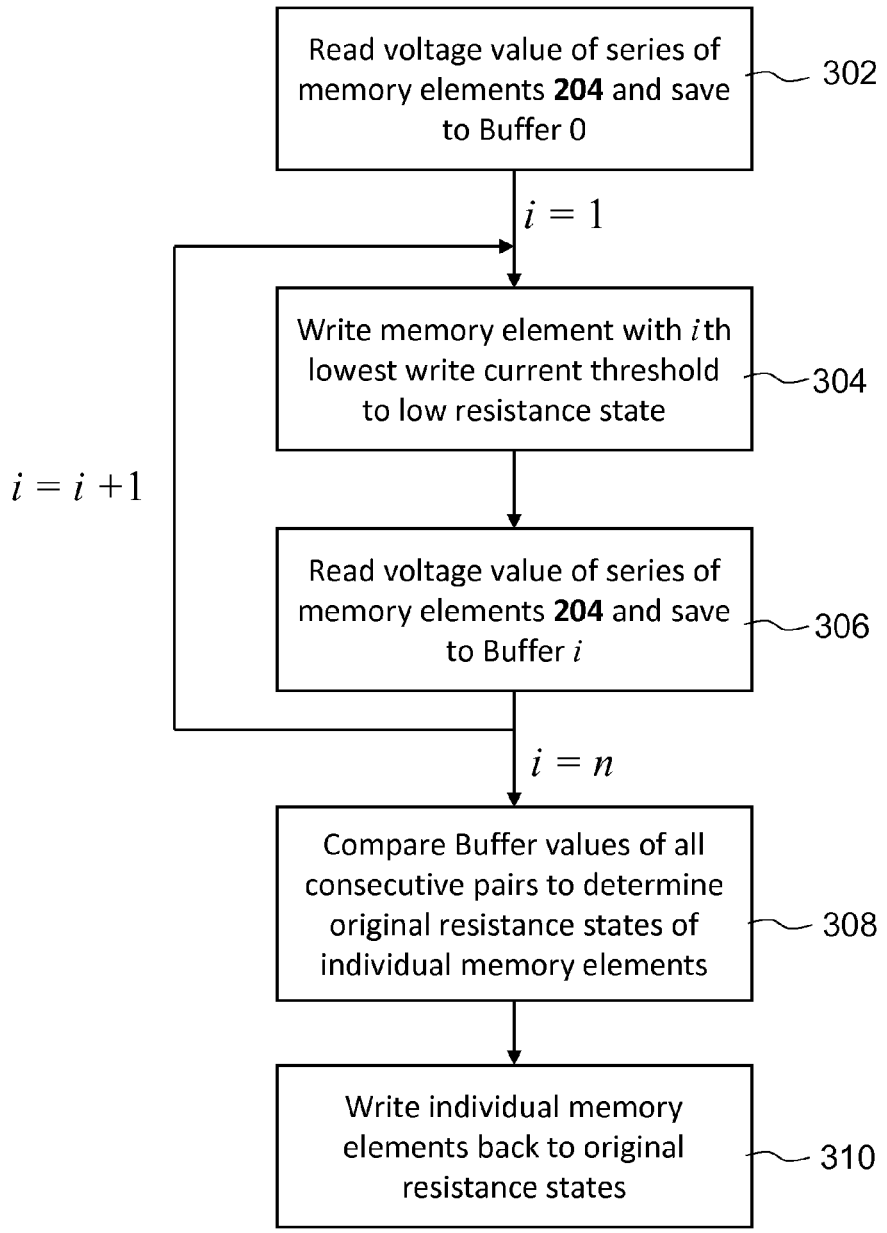
FIG. 6 illustrates selected stages in a method embodiment of the present invention that identifies resistance states of individual memory elements coupled in series.
Figure 9:
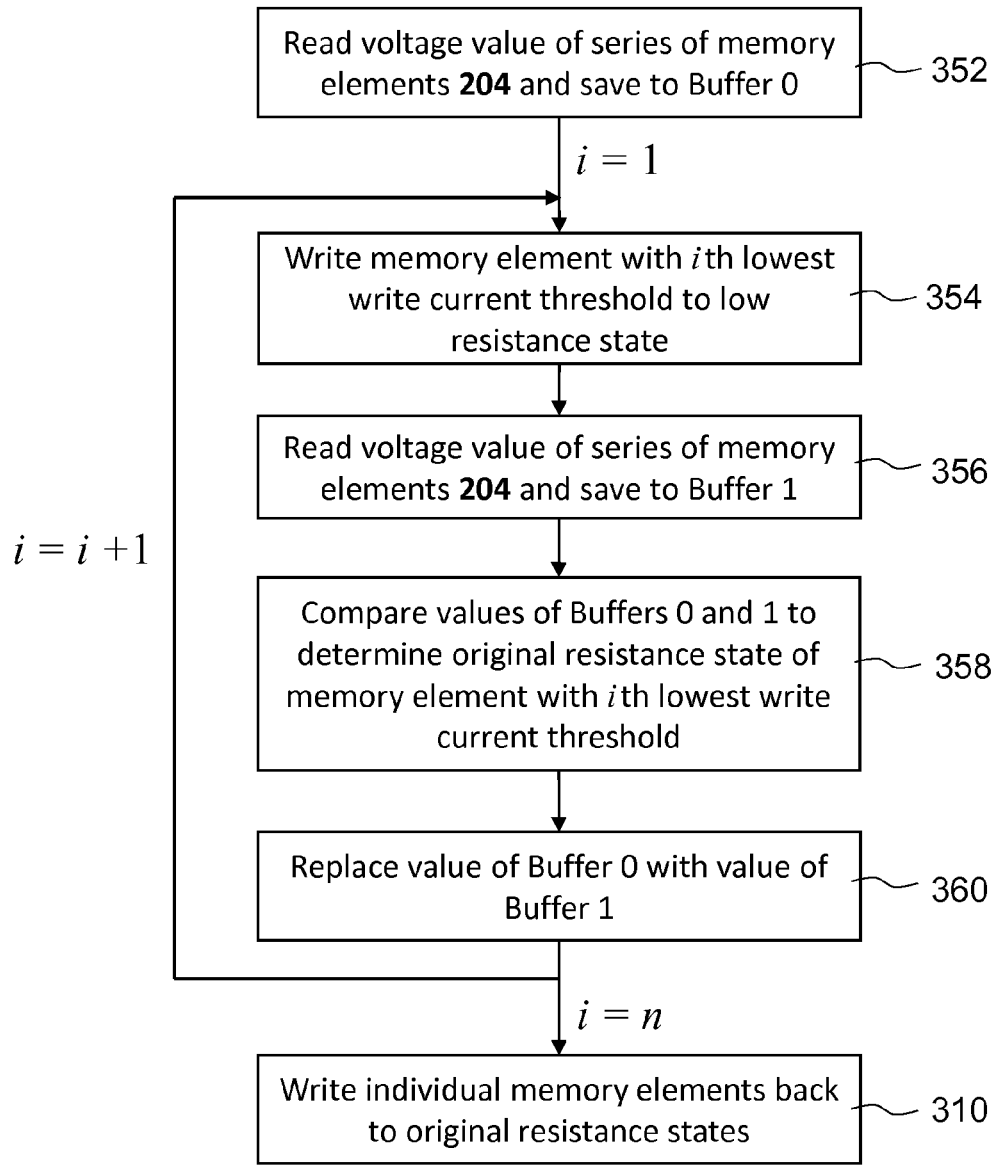
FIG. 9 illustrates selected stages in another method embodiment of the present invention that identifies resistance states of individual memory elements coupled in series.
Figure 10:
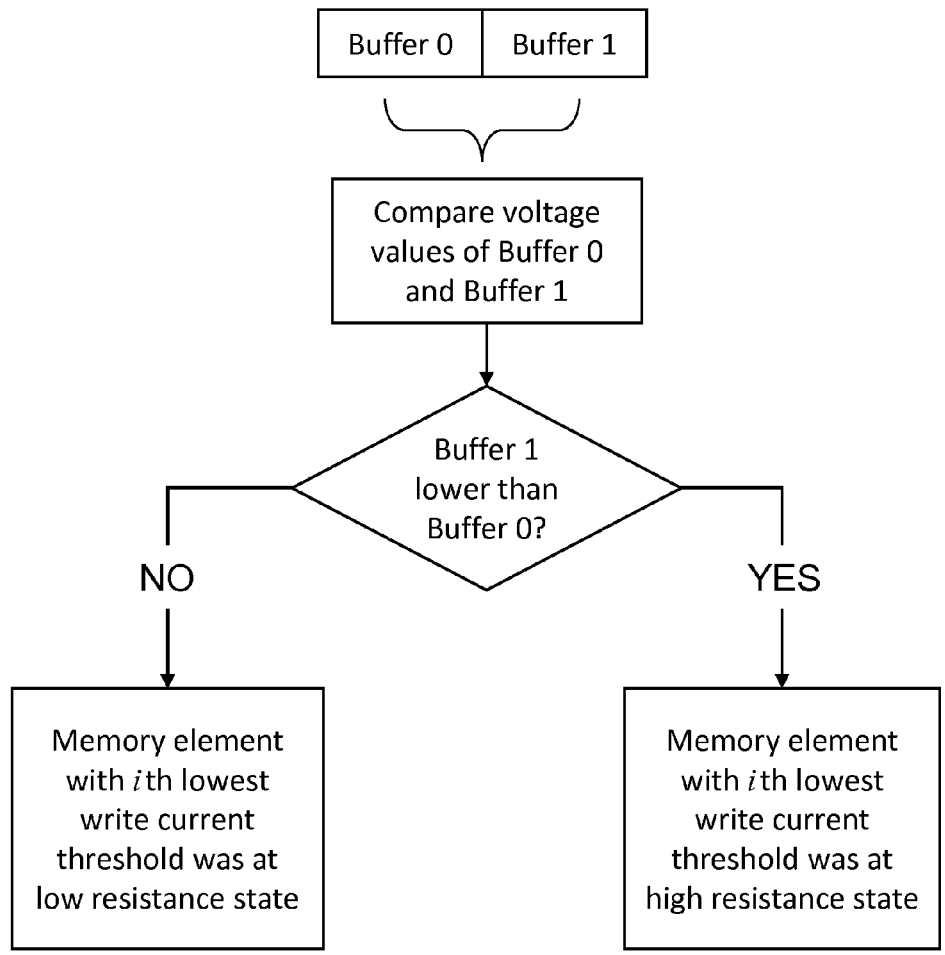
FIG. 10 illustrates selected stages of a comparison method to determine whether a memory element has switched the resistance state thereof for the embodiment of FIG. 9.

The method embodiment of FIG. 9, which uses only two buffer entries, is different from the method embodiment of FIG. 6 in that after each writing step 354, the resistance state is determined from the values in the buffer 358 prior to writing the next element with higher parallelizing current threshold. In the method embodiment of FIG. 6, the resistance states of memory elements can be determined after writing each element or after writing all elements to the low resistance state because the process has enough buffer entries to accommodate all resistance values generated from writing the series of MTJ memory elements 204.

Still another embodiment of the present invention for detecting individual resistance states of the series of MTJ memory elements 204 having n number of MTJ memory elements coupled in series will now be described with reference to FIG. 11, which shows a plot of the parallelizing write current versus time on top and a plot of the corresponding voltage value of the series of MTJ memory elements 204 on bottom while writing four memory elements in order of ascending write current threshold. As the first write current pulse passes through the series of MTJ memory elements 204, the memory element with the lowest write current threshold switches to the low resistance state as indicated by the change in the corresponding voltage value. The change of resistance state can be ascertained by comparing the voltage values near the beginning and end of the write current pulse, which are marked by the solid and open circles, respectively. Accordingly, the original resistance state of the memory element with the lowest write current threshold was at the high resistance level. The voltage values near the beginning and end of the write current pulse for the memory element with the second lowest write current threshold are substantially the same, indicating that the original resistance state of the same memory element was already at the low resistance level prior to writing. The same procedures can be extended to the rest of the series of memory elements 204. The present embodiment is different from the method embodiments of FIGS. 6 and 9 in that the voltage value is conveniently read during the write process illustrated in FIG. 11 rather than using a separate read current to read the voltage value. The current embodiment of comparing the voltage values near the beginning and end of a write step can also be used with a step-like write current input as illustrated in FIG. 12, in which the write current continuously increases in a step-wise manner until all elements are written to the low resistance state.

Figure 11:
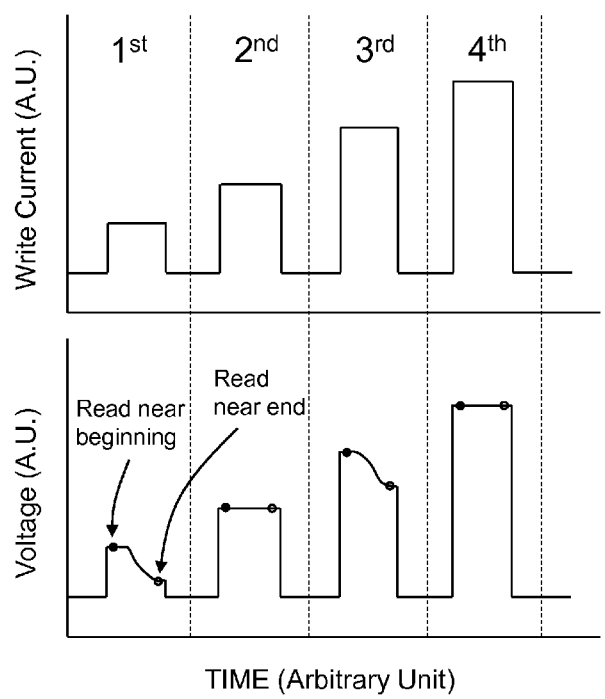
FIG. 11 shows a plot of write current versus time and corresponding voltage for sequentially writing each memory element of an MLC.
Figure 12:
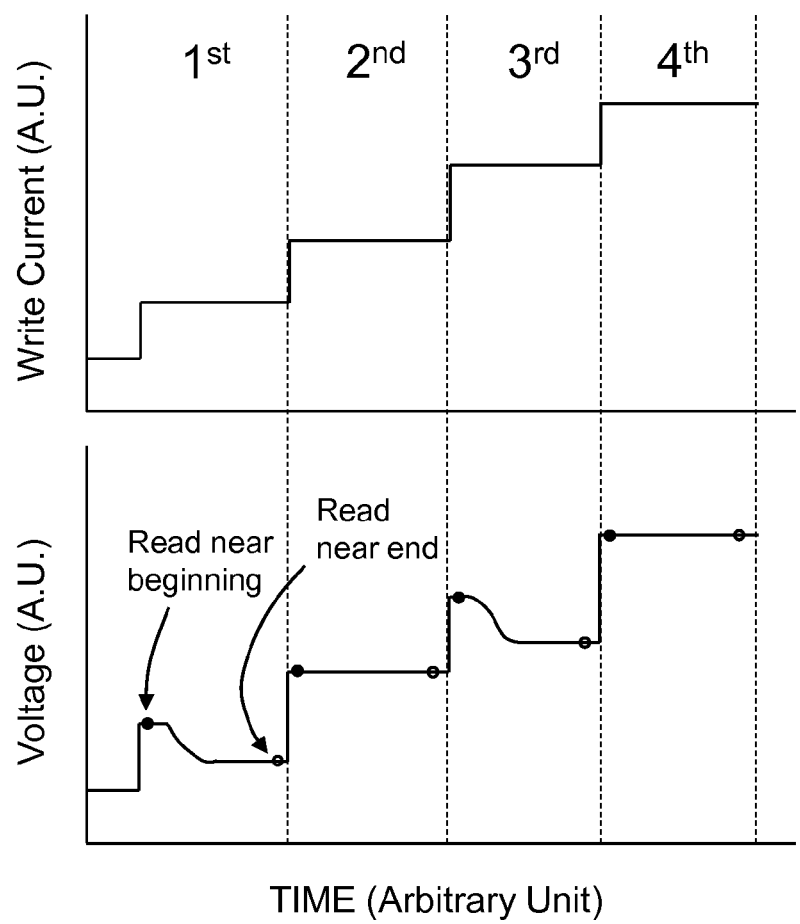
FIG. 12 shows another plot of write current versus time and corresponding voltage for sequentially writing each memory element of an MLC.
Figure 13:
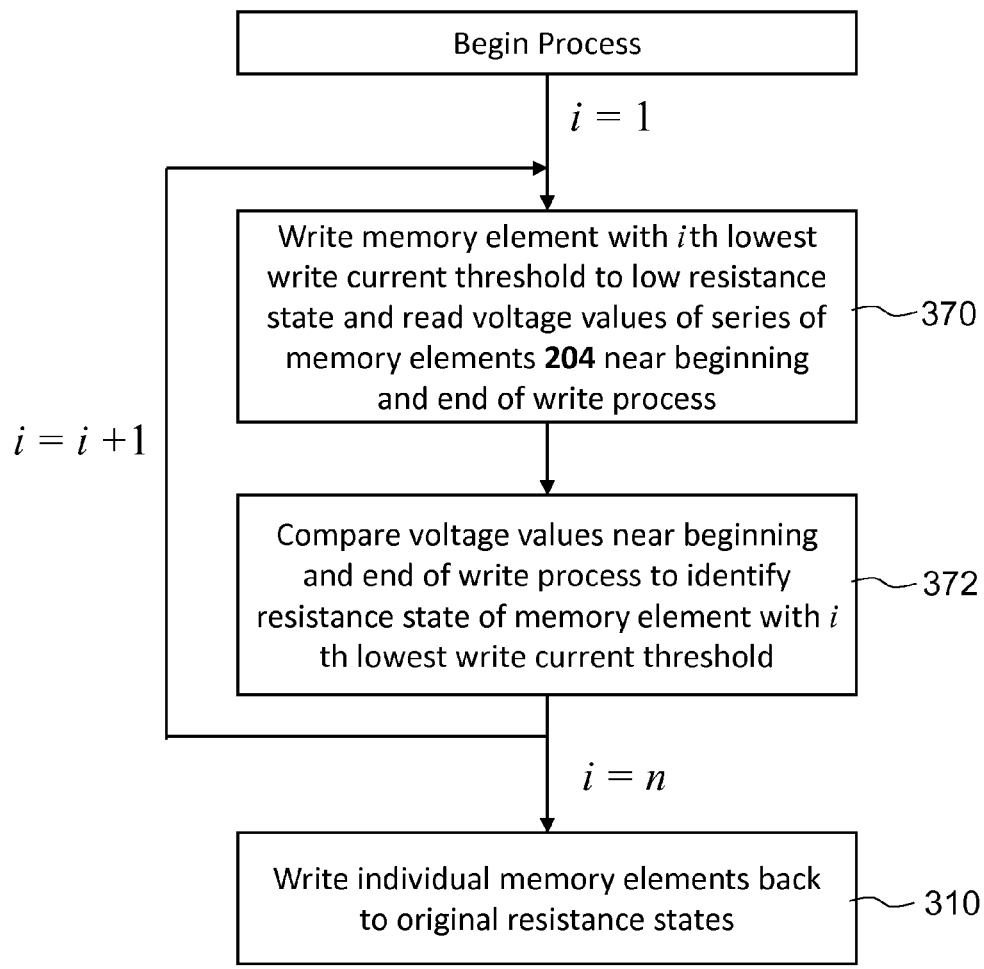
FIG. 13 illustrate selected stages in still another method embodiment of the present invention corresponding to FIGS. 11 and 12.

FIG. 13 illustrates a method embodiment corresponding to FIGS. 11 and 12. The process begins by sequentially writing each of the series of memory elements 204 to the low resistance state in order of ascending parallelizing write current threshold while reading the corresponding voltage values near the beginning and end of the write step 370. The voltage values near the beginning and end of the write step are compared to identify the original resistance state 372 following the process steps described in FIG. 10. The voltage values near the beginning and end of the write step correspond to those of Buffers 0 and 1, respectively. If the voltage value near the beginning is higher than that near the end of the write step, then the original resistance state was at the high resistance level. If there is no substantial difference between the two voltage values, then the original resistance state was at the low resistance level.

With continuing reference to FIG. 13, after the resistance states of all individual memory elements are identified 372, the resistance states of all individual memory elements of the series of MTJ memory elements 204 will be in the low resistance state. Accordingly, the present embodiment may further include the step of writing individual memory elements back to the original states thereof 310 described above.

Figure 14:
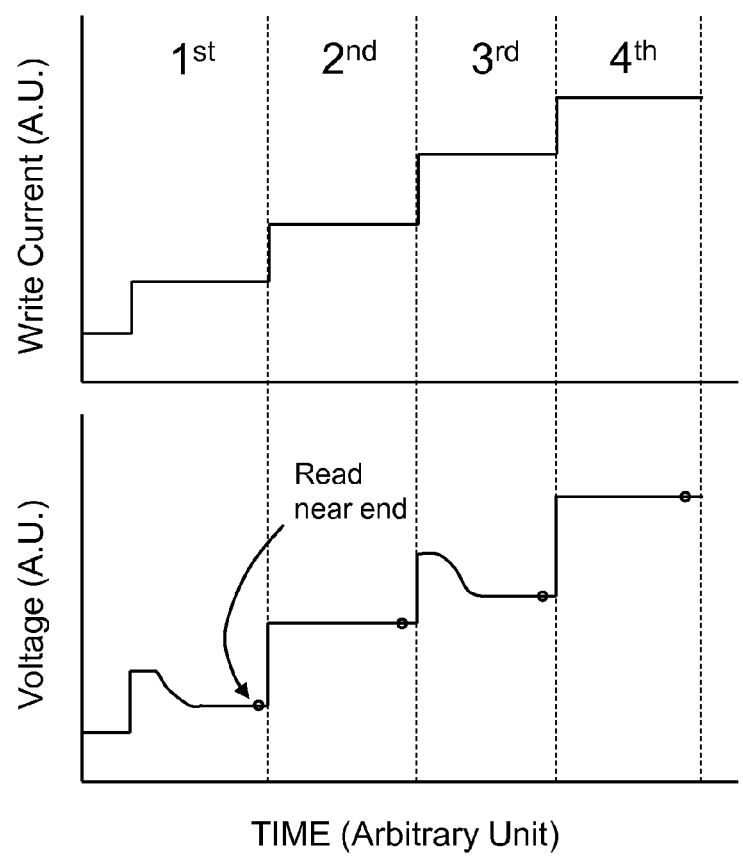
FIG. 14 illustrate still another plot of write current versus time and corresponding voltage for sequentially writing each memory element of an MLC.

An alternative way to the sampling the voltages values near the beginning and end of a write step as shown in FIGS. 11 and 12 is to only read the voltage value near the end of a write step as illustrated in FIG. 14. This approach requires fewer sampling points but needs a more complicated algorithm to ascertain whether the element has switched because consecutive voltage values are read with different current. One possible algorithm is to convert the voltage value to the resistance value of the series of MTJ memory elements 204 before comparison, thereby eliminating the effect of current variation. Another possible algorithm is to compare the voltage values while taking the current variation into account.

Figure 15:
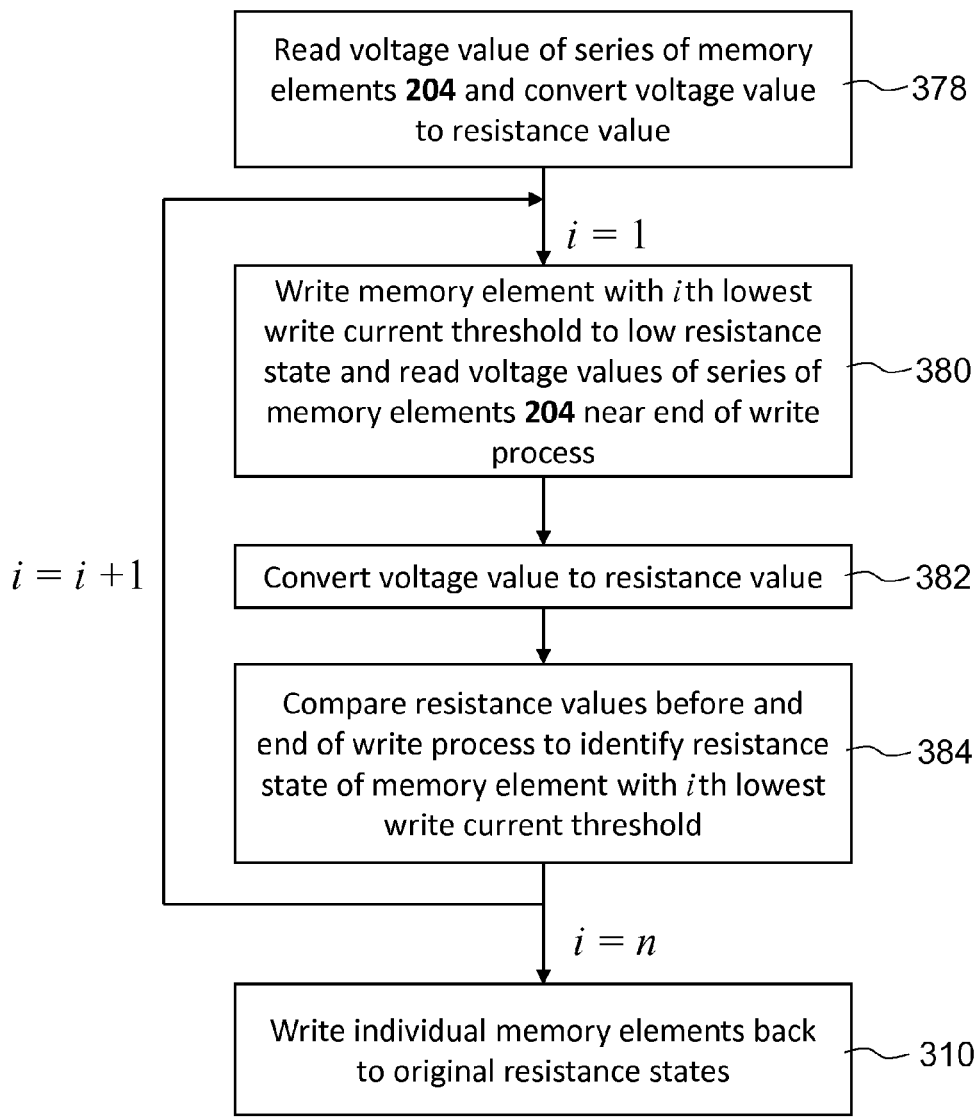
FIG. 15 illustrate selected stages in yet still another method embodiment of the present invention corresponding to FIG. 11.

FIG. 15 illustrates a method embodiment corresponding to the alternative sampling scheme of FIG. 14. The process begins by reading the voltage value of the series of MTJ memory elements 204 and converting the voltage value to the resistance value 378. Each of the n number of the MTJ memory elements in the series 204 is then sequentially written to the low resistance state from the element with the lowest parallelizing write current threshold to the element with the highest parallelizing write current threshold and read the voltage value near the end of the write process 380. The voltage value is converted to the resistance value for subsequent analysis 382. The resistance state of the each of the n number of the MTJ memory elements is identified by comparing the resistance values before and near the end of the write process 384 as illustrated in FIG. 10. The method may optionally include the step of writing individual memory elements back to the original resistance states thereof 310.

While the embodiments of FIGS. 6, 9, 13, and 15 have described the writing of each memory element to the low resistance state, it should be noted that each memory element can also be written to the high resistance state in the present invention. The comparison schemes of FIGS. 7 and 10 can be readily modified to accommodate the writing of memory elements to the high resistance state as would be understood by one of skill in the art. For example, in the case that all memory elements are written to the high resistance state, if the voltage value increases after writing an element, then the original resistance state of the element was at the low resistance level.

The present invention can operate an MLC including a plurality of memory elements having substantially the same high and low resistance levels, which is an obvious advantage when compared with the prior art methods in U.S. Pat. Application Publication No. US 2012/0243311 A1 and U.S. Pat. Application Publication No. US 2012/0134200 A1. The prior art methods disadvantageously relies on each of the memory elements in the MLC to have a different low resistance level and a different high resistance level from the rest of the elements in order to assign a unique set of resistance states to a combined resistance or voltage value. Moreover, as the number of the memory elements and corresponding unique resistance states increase, the difference between a resistance or voltage value and the closest value thereto decreases, thereby hampering the ability of the prior art methods to differentiate sets of resistance states. In contrast, the present invention utilizes the approach of sequentially writing the memory elements with ascending write current threshold for identifying the resistance states of individual elements can advantageously isolate the resistance change to the written memory element. Therefore, the effectiveness of the present method in identifying the resistance states is relatively independent of the number of memory elements in an MLC.

Figure 16:
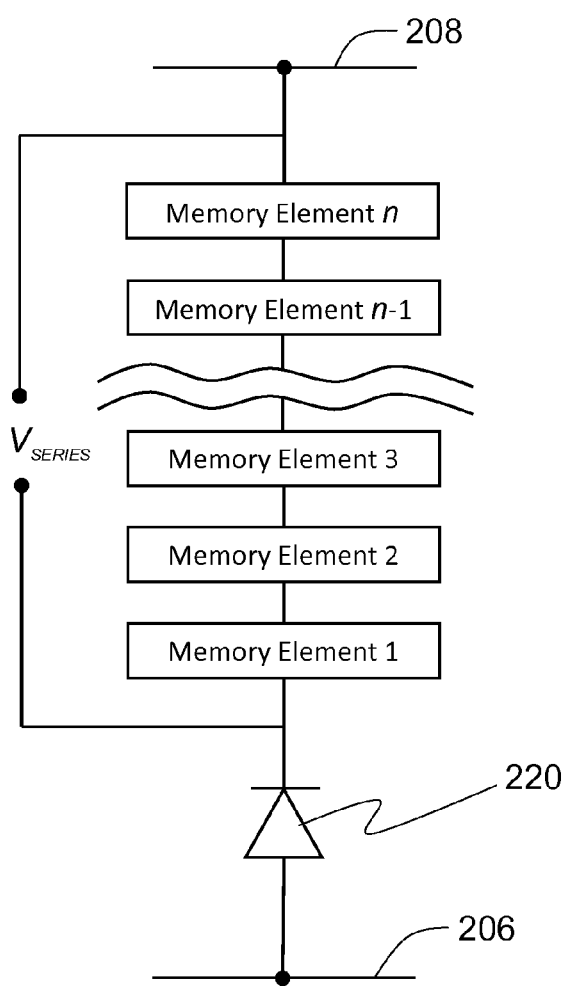
FIG. 16 is a schematic view of an MLC, including a selection diode coupled to multiple memory elements in series, that can be operated by the method of the present invention.

It is clear from the foregoing disclosure of the method embodiments of FIGS. 6, 9, 13, and 15 that the present invention can be used to operate other types of MLCs with each of the memory element thereof having a first electrical state and a second electrical state. The electrical states can be characterized by electric potential, electric resistance, electric current, or any combination thereof. The MLC has an electrical value corresponding to the electrical states of the memory elements thereof. The electrical value can be any suitable parameter, such as but not limited to voltage, resistance, current, or any combination thereof. The memory element can be switched from the first electrical state to the second electrical state by a first switching input no less than a first switching input threshold. Conversely, the memory element can be switched from the second electrical state to the first electrical state by a second switching input no less than a second switching input threshold. The first and second switching input thresholds of any element in the MLC are substantially different from those of the rest of the elements in the MLC such that writing any memory element of the MLC would not perturb the electrical states of the memory elements that have higher switching input thresholds. The switching inputs can be in the form of any suitable switching means, such as but not limited to electric potential, electric field, electric current, magnetic field, temperature, pressure, mechanical stress, or any combination thereof. Moreover, the first and second switching inputs can have the same polarity (unipolar) or opposite polarities (bipolar). Memory elements that can be switched by unipolar switching inputs may also be coupled to a selection diode 220 as shown in FIG. 16.

The method of detecting the electrical states of individual memory elements of a MLC by sequentially writing each memory element to the same electrical state, say the second electrical state, in order of ascending write input threshold. If a written element switches the electrical state thereof after the write step, then the written element was in the first electrical state prior to the write step. Otherwise, the written element was in the second electrical state prior to the write step. The switching of the electrical state can be ascertained by comparing the electrical values of the plurality of memory elements before and after writing each of the plurality of memory elements in accordance with several embodiments of the present invention. If there is no substantial difference between the electrical values before and after writing, then the electrical state of the written element has not switched. If there is substantial difference between the electrical values before and after writing, then the electrical state of the written element has switched. The method of the present invention may include the optional step of sequentially writing each of the plurality of memory elements to the original electrical state thereof from the second electrical level in order of descending first and second write input thresholds. The same method can also be used to write the plurality of memory elements from an arbitrary set of electrical states to another arbitrary set of electrical states by writing each element in order of descending first and second write input thresholds.

The previously described embodiments of the present invention have many advantages. It is important to note, however, that the invention does not require that all the advantageous features and all the advantages need to be incorporated into every embodiment of the present invention.

While the present invention has been shown and described with reference to certain preferred embodiments, it is to be understood that those skilled in the art will no doubt devise certain alterations and modifications thereto which nevertheless include the true spirit and scope of the present invention. For example, there are a plethora of possible sampling schemes to read the voltage value of the MLC in order to ascertain the switching of a memory element. Thus the scope of the invention should be determined by the appended claims and their legal equivalents, rather than by examples given.

Any element in a claim that does not explicitly state "means for" performing a specified function, or "step for" performing a specific function, is not to be interpreted as a "means" or "step" clause as specified in 35 U.S.C. §112, ¶ 6. In particular, the use of "step of" in the claims herein is not intended to invoke the provisions of 35 U.S.C. §112, ¶ 6.

What is claimed is:

1. A method for detecting individual resistance states of a plurality of memory elements coupled in series in a memory device, each of the plurality of memory elements having a resistance state that can be switched from a first resistance level to a second resistance level by a write input no lower than a write threshold, the method comprising the steps of:

sequentially writing each of the plurality of memory elements to the second resistance level in order of ascending write threshold;

ascertaining whether the each of the plurality of memory elements has switched the resistance state thereof;

concluding the each of the plurality of memory elements is in the first resistance level if the each of the plurality of memory elements has switched the resistance state thereof; and concluding the each of the plurality of memory elements is in the second resistance level if the each of the plurality of memory elements has not switched the resistance state thereof.

2. A method for detecting individual electrical states of a plurality of memory elements coupled in series in a memory device, each of the plurality of memory elements having an electrical state that can be switched from a first electrical level to a second electrical level by a first write input no lower than a first write input threshold and can be switched back from the second to the first electrical level by a second write input no lower than a second write input threshold, the plurality of memory elements having an electrical value corresponding to a set of electrical states of the plurality of memory elements, the method comprising the steps of:

sequentially writing each of the plurality of memory elements to the second electrical level in order of ascending first write input threshold;

ascertaining whether the each of the plurality of memory elements has switched the electrical state thereof;

concluding the each of the plurality of memory elements is in the first electrical level if the each of the plurality of memory elements has switched the electrical state thereof; and concluding the each of the plurality of memory elements is in the second electrical level if the each of the plurality of memory elements has not switched the electrical state thereof, wherein the first and second write input thresholds of the each of the plurality of memory elements are substantially different from those of the rest of the plurality of memory elements such that writing the each of the plurality of memory elements would not perturb the electrical states of ones of the plurality of memory elements that have higher write input thresholds.

3. The method of claim 2, further comprising the step of sequentially writing each of the plurality of memory elements to the electrical state thereof from the second electrical level in order of descending first and second write input thresholds.

4. The method of claim 2, wherein the step of ascertaining whether the each of the plurality of memory elements has switched the electrical state thereof comprises:

comparing the electrical values of the plurality of memory elements before and after writing the each of the plurality of memory elements;

concluding the electrical state of the each of the plurality of memory elements has not switched if there is no substantial difference between the electrical values before and after writing; and concluding the electrical state of the each of the plurality of memory elements has switched if there is substantial difference between the electrical values before and after writing.

5. A method for writing individual electrical states of a plurality of memory elements coupled in series in a memory device, each of the plurality of memory elements having an electrical state that can be switched from a first electrical level to a second electrical level by a first write input no lower than a first write input threshold and can be switched back from the second to the first electrical level by a second write input no lower than a second write input threshold, the method comprising the step of sequentially writing each of the plurality of memory elements to a desired electrical state in order of descending first and second write input thresholds, wherein the first and second write input thresholds of the each of the plurality of memory elements are substantially different from those of the rest of the plurality of memory elements such that writing the each of the plurality of memory elements would not perturb the electrical states of ones of the plurality of memory elements that have higher write input thresholds.

6. A method for detecting individual resistance states of a plurality of magnetic tunnel junction (MTJ) memory elements coupled in series in a spin transfer torque random access memory (STT-MRAM) device, each of the plurality of MTJ memory elements having a resistance state that can be switched from a first resistance level to a second resistance level by a first write current no lower than a first write current threshold flowing in a first direction and can be switched back from the second to the first resistance level by a second write current no lower than a second write current threshold flowing in a second direction, the plurality of MTJ memory elements having an electrical value corresponding to a set of resistance states of the plurality of MTJ memory elements, the method comprising the steps of:

sequentially writing each of the plurality of MTJ memory elements to the second resistance level in order of ascending first write current threshold;

ascertaining whether the each of the plurality of MTJ memory elements has switched the resistance state thereof;

concluding the each of the plurality of MTJ memory elements is in the first resistance level if the each of the plurality of MTJ memory elements has switched the resistance state thereof; and concluding the each of the plurality of MTJ memory elements is in the second resistance level if the each of the plurality of MTJ memory elements has not switched the electrical state thereof.

7. The method of claim 6, further comprising the step of sequentially writing each of the plurality of MTJ memory elements to the resistance state thereof from the second resistance level in order of descending first and second write current thresholds.

8. The method of claim 6, wherein each of the plurality of MTJ memory elements has a different planar dimension.

9. The method of claim 6, wherein the step of ascertaining whether the each of the plurality of MTJ memory elements has switched the resistance state thereof comprises:

comparing the electrical values of the plurality of MTJ memory elements before and after writing the each of the plurality of MTJ memory elements;

concluding the resistance state of the each of the plurality of MTJ memory elements has not switched if there is no substantial difference between the electrical values before and after writing; and concluding the resistance state of the each of the plurality of MTJ memory elements has switched if there is substantial difference between the electrical values before and after writing.

10. The method of claim 9, wherein the electrical value corresponds to voltage.

11. The method of claim 9, wherein the electrical value corresponds to electric resistance.

12. The method of claim 6, wherein the first resistance level is lower than the second resistance level.

13. The method of claim 6, wherein the first resistance level is higher than the second resistance level.

14. The method of claim 13, wherein the step of ascertaining whether the each of the plurality of MTJ memory elements has switched the resistance state thereof comprises:
   comparing the electrical values of the plurality of MTJ memory elements before and after writing the each of the plurality of MTJ memory elements;
   concluding the resistance state of the each of the plurality of MTJ memory elements has not switched if there is no substantial difference between the electrical values before and after writing; and
   concluding the resistance state of the each of the plurality of MTJ memory elements has switched if the electrical value after writing is substantially lower than the voltage value before writing.

15. The method of claim 13, wherein the electrical value corresponds to voltage.

16. The method of claim 13, wherein the electrical value corresponds to electric resistance.

17. The method of claim 13, wherein the step of ascertaining whether the each of the plurality of MTJ memory elements has switched the resistance state thereof comprises:
   comparing the electrical values of the plurality of MTJ memory elements before and near end of writing the each of the plurality of MTJ memory elements;
   concluding the resistance state of the each of the plurality of MTJ memory elements has not switched if there is no substantial difference between the electrical values before and near end of writing; and
   concluding the resistance state of the each of the plurality of MTJ memory elements has switched if the electrical value near end of writing is substantially lower than the electric value before writing,
   wherein the electric value corresponds to electric resistance.

18. The method of claim 13, wherein the step of ascertaining whether the each of the plurality of MTJ memory elements has switched the resistance state thereof comprises:
   comparing the electrical values of the plurality of MTJ memory elements near beginning and end of writing the each of the plurality of MTJ memory elements;
   concluding the resistance state of the each of the plurality of MTJ memory elements has not switched if the electrical value near end of writing is substantially same or higher than the electric value near beginning of writing; and
   concluding the resistance state of the each of the plurality of MTJ memory elements has switched if the electrical value near end of writing is substantially lower than the electric value near beginning of writing.

19. The method of claim 18, wherein the electrical value corresponds to voltage.

20. The method of claim 18, wherein the electrical value corresponds to electric resistance.

21. A method for writing individual resistance states of a plurality of magnetic tunnel junction (MTJ) memory elements coupled in series in a spin transfer torque random access memory (STT-MRAM) device, each of the plurality of MTJ memory elements having a resistance state that can be switched from a high resistance level to a low resistance level by a parallelizing write current no lower than a parallelizing write current threshold and can be switched back from the low to the high resistance level by an anti-parallelizing write current no lower than an anti-parallelizing write current threshold, the method comprising the step of sequentially writing each of the plurality of MTJ memory elements to a desired resistance state in order of descending parallelizing and anti-parallelizing write current thresholds, wherein the parallelizing and anti-parallelizing write current thresholds of any of the plurality of MTJ memory elements are substantially different from those of the rest of the plurality of MTJ memory elements such that writing any of the plurality of MTJ memory elements would not perturb the resistance states of ones of the plurality of MTJ memory elements that have higher write current thresholds.

* * * * *